（12） United States Patent
Matsuura et al.

(10) Patent No.: US 8,508,192 B2
(45) Date of Patent: Aug. 13, 2013

(54) BATTERY PACK CAPABLE OF CALCULATING RELATIVE REMAINING CAPACITY

(75) Inventors: Shinichi Matsuura, Sumoto (JP); Atsushi Kawasumi, Sumoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 458 days.

(21) Appl. No.: 12/961,898

(22) Filed: Dec. 7, 2010

(65) Prior Publication Data
US 2011/0133697 A1    Jun. 9, 2011

(30) Foreign Application Priority Data
Dec. 9, 2009 (JP) ................................ 2009-279448

(51) Int. Cl.
*H02J 7/00* (2006.01)

(52) U.S. Cl.
USPC .......................................................... 320/132

(58) Field of Classification Search
USPC .......................................................... 320/132
See application file for complete search history.

(56) References Cited

U.S. PATENT DOCUMENTS

| 6,025,695 | A  | * | 2/2000 | Friel et al. ..................... 320/106 |
| 6,424,123 | B1 | * | 7/2002 | Odaohhara et al. ........... 320/134 |
| 7,191,077 | B2 | * | 3/2007 | Mese et al. ....................... 702/63 |
| 7,522,941 | B2 | * | 4/2009 | Lu ..................................... 455/574 |
| 7,977,916 | B2 | * | 7/2011 | Hayakawa ..................... 320/134 |

FOREIGN PATENT DOCUMENTS
JP    2002-78222    3/2002

* cited by examiner

*Primary Examiner* — Ramy Ramadan
(74) *Attorney, Agent, or Firm* — Wenderoth, Lind & Ponack, LLP

(57) ABSTRACT

A remaining capacity calculating section is provided that acquires a discharged capacity of a rechargeable battery based on a discharging current and a discharging time of the rechargeable battery, and calculates a relative remaining capacity of the rechargeable battery based on the discharged capacity and the fully-charged capacity of the rechargeable battery. The remaining capacity calculating section employs the rating capacity of the rechargeable battery or a learned fully-charged capacity as the fully-charged capacity when a high capacity mode is selected, and employs a capacity obtained by multiplying the rating capacity or learned fully-charged capacity by a predetermined factor not more than 1 as the fully-charged capacity when a long life mode is selected.

8 Claims, 5 Drawing Sheets

BATTERY PACK CAPABLE OF CALCULATING RELATIVE REMAINING CAPACITY

BACKGROUND OF THE INVENTION

1. Field of the Invention

The present invention relates to a battery pack that can change the maximum charging voltage of a rechargeable battery to select a high capacity mode in that the fully-charged capacity of a rechargeable battery can be higher or a long life mode in that the cycle life of the rechargeable battery can be longer, and in particular to a battery pack that can easily acquire a relative remaining capacity of a rechargeable battery depending on a selected operation mode.

2. Description of the Related Art

Electronic devices such as note personal computer (PC) often include a battery packs that serves as a power supply portion, and includes a rechargeable battery and a controlling/calculating portion for controlling charging/discharging operation of the rechargeable battery. A rechargeable battery in this type of battery pack is charged from an external power supply (commercial power supply) via a power supply portion of an electronic device, for example, and supplies electronic power to the electronic device instead of the external power source when the electronic device is disconnected from the external power source.

An example of the rechargeable batteries can be provided by lithium ion battery. The characteristics of lithium ion battery, in particular, the charged capacity and the cycle life of lithium ion battery vary in accordance with charging voltage, as shown in FIG. 6. Specifically, when a rechargeable battery (lithium ion battery) is charged to a higher voltage as the maximum charging voltage, the charged capacity of the rechargeable battery can be higher but the cycle life of the rechargeable battery will be shorter as shown by a property line A in FIG. 6. Conversely, when a rechargeable battery (lithium ion battery) is charged to a lower voltage as the maximum charging voltage, although the charged capacity of the rechargeable battery will be lower, the cycle life of the rechargeable battery can be longer as shown by a property line B in FIG. 6.

From the characteristics of rechargeable battery, it has been conceived that voltages as the maximum charging voltage are selected in charging operation of the rechargeable battery so that the battery pack are selectively used in a high capacity (RT) mode and a long life (LS) mode (see Japanese Patent Laid-Open Publication No. 2002-78222, for example).

Specifically, the rechargeable battery (lithium ion battery) is charged to the maximum charging voltage of 4.2 V/cell in the high capacity mode, and is charged to the maximum charging voltage of 4.1 V/cell.

SUMMARY OF THE INVENTION

When the aforementioned battery pack is mounted to an electronic device and operates, it is important to accurately ascertain a remaining capacity of the rechargeable battery. Generally, when a remaining capacity of a rechargeable battery is ascertained, a relative remaining capacity (RSOC) is often used to control a remaining capacity of the rechargeable battery. The relative remaining capacity (RSOC) is obtained as the ratio of a remaining capacity (RC) of the rechargeable battery to the fully-charged state (fully-charged capacity; FCC) of the rechargeable battery, where the fully-charged state is defined as 100%.

However, in the case of the battery pack that is selectively used between the aforementioned high capacity and long life modes, the rating capacities (DC) or the fully-charged capacities (FCC) of the rechargeable battery in these operation modes are different from each other. In order to accurately (precisely) acquire a relative remaining capacity, it is necessary to ascertain the rating capacities and the fully-charged capacities as well as remaining capacity calculation parameters and the like. This ascertainment may be complicated.

The present invention is aimed at solving the above problem, and its main object is to provide a battery pack that includes a rechargeable battery to be selectively used between high capacity and long life modes, and can easily but precisely acquire a relative remaining capacity of the rechargeable battery depending on a selected operation mode even when the operation mode is switched from one to another.

To achieve the aforementioned object, a battery pack according to the present invention includes a rechargeable battery, and a controlling/calculating portion that controls charging/discharging operation of this rechargeable battery. The controlling/calculating portion includes an operation mode setting section and a remaining capacity calculating section. The operation mode setting section selects a high capacity mode (RT mode) or a long life mode (LS mode). In the high capacity mode, the maximum charging voltage of the rechargeable battery is limited to a first voltage so that the fully-charged capacity of the rechargeable battery can be higher. In the long life mode, the maximum charging voltage is limited to a second voltage lower than the first voltage (e.g., by about 100 mV) so that the cycle life of the rechargeable battery can be longer. The remaining capacity calculating section acquires a discharged capacity (RD) of the rechargeable battery based on a discharging current and a discharging time of the rechargeable battery, and calculates a relative remaining capacity (RSOC) of the rechargeable battery based on the discharged capacity and the fully-charged capacity (FCC) of the rechargeable battery. The remaining capacity calculating section employs the rating capacity or a learned fully-charged capacity of the rechargeable battery as the fully-charged capacity when one operation mode of the high capacity and long life modes is selected, and employs a capacity obtained by multiplying the rating capacity or learned fully-charged capacity by a predetermined factor as the fully-charged capacity when another operation mode is selected.

The remaining capacity calculating section preferably employs the rating capacity (DC) or a learned fully-charged capacity (FCCnew), which is acquired based on the acquired charged capacity, of the rechargeable battery as the fully-charged capacity ($FCC_{(RT)}$) when the high capacity mode is selected, and employs a capacity obtained by multiplying the rating capacity or learned fully-charged capacity by a predetermined factor not more than 1 (e.g., 90%) as the fully-charged capacity ($FCC_{(LS)}$) when the long life mode is selected.

The remaining capacity calculating section preferably recalculates the relative remaining capacity, when the operation mode is switched from one to another.

For example, the rechargeable battery can be a lithium ion battery. In this case, the first voltage in the high capacity mode to which the maximum charging voltage can be limited is set at 4.2 V/cell, and the second voltage in the long life mode to which the maximum charging voltage is limited can be set at 4.1 V/cell.

In the high capacity mode, it is preferable that the discharged capacity be divided by a variation amount of relative remaining capacity in discharging operation whereby acquiring the learned fully-charged capacity. Also, in the long life mode, it is preferable that a capacity acquired by dividing the discharged capacity by a variation amount of relative remaining capacity in discharging operation be divided by the predetermined factor not more than 1 whereby acquiring the learned fully-charged capacity.

For example, the learned fully-charged capacity can be updated every when a predetermined cycle of charging/discharging operation ends.

In addition, the remaining capacity calculating section employs the fully-charged capacity depending on a selected operation mode and calculates the relative remaining capacity based on the rating capacity of the rechargeable battery when the rechargeable battery is charged to the fully-charged state for the first time, and after that employs the fully-charged capacity depending on a selected operation mode and calculates the relative remaining capacity based on the learned fully-charged capacity, which is calculated in discharging operation, when the rechargeable battery is discharged to a capacity lower than a predetermined lower discharging limit capacity (e.g., relative remaining capacity of 40%). Also, the remaining capacity calculating section restricts the maximum value of relative remaining capacity to 100% when the operation mode is switched from the high capacity mode to the long life mode.

According to the thus-constructed battery pack, it is possible to ascertain a single rating capacity of a rechargeable battery or a single learned fully-charged capacity obtained by leaning based on a discharged capacity of this rechargeable battery irrespective of selected operation modes when the fully-charged capacity is employed as the basis on which to calculate a relative remaining capacity of the rechargeable battery depending on a selected operation mode. Therefore, the relative remaining capacity can be easily and precisely calculated only by acquiring the discharged capacity of the rechargeable battery. Even when the operation mode is switched from one to another, this construction can easily provide precise recalculation of the relative remaining capacity for this another operation mode.

The above and further objects of the present invention as well as the features thereof will become more apparent from the following detailed description to be made in conjunction with the accompanying drawings.

DETAILED DESCRIPTION OF THE EMBODIMENT(S)

The following description will describe a battery pack 10 according to an embodiment of the present invention with reference to the drawings.

Figure 1:
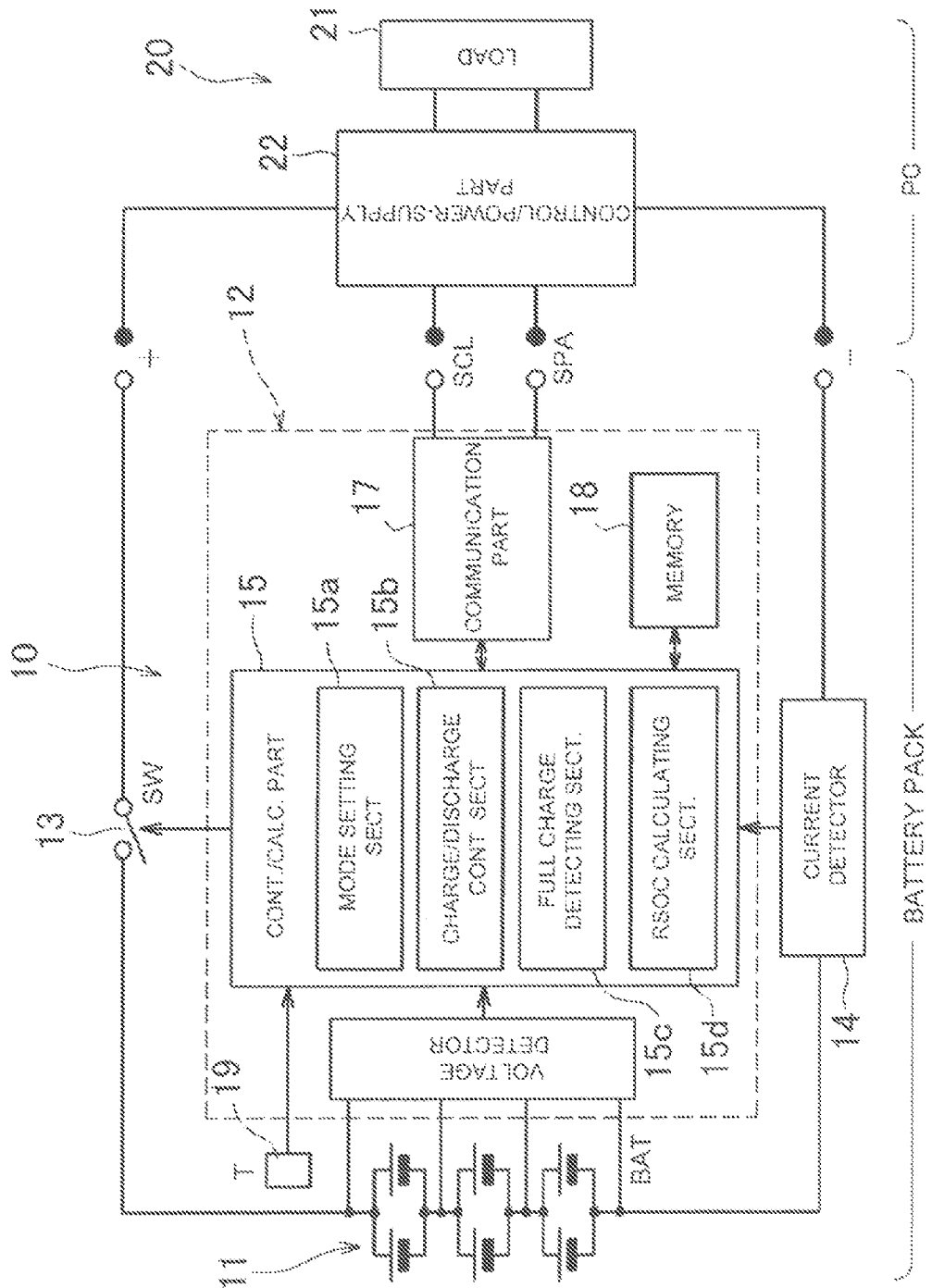
FIG. 1 is a construction diagram schematically showing major portions of a battery pack according to an embodiment of the present invention.

FIG. 1 is a construction diagram schematically showing major portions of the battery pack 10 according to the present invention. The battery pack 10 is detachably attached to an electronic device 20 such as a note personal computer (PC). The battery pack 10 basically includes a rechargeable battery (BAT) 11, and a controller 12 that controls charging/discharging operation of this rechargeable battery 11. The battery pack 10 operates with the battery pack 10 being attached to the load device 20.

Specifically, the rechargeable battery 11 in the battery pack 10 includes a plurality of battery cells such as lithium ion batteries of about 2600 mAh/cell. For example, the battery cells are composed of three pairs of battery cells. The three pairs of battery cells are connected to each other in serial. Each pair includes two battery cells that are connected to each other in parallel. Thus, the rechargeable battery 11 has so-called "three serial set and two parallel cell construction". Although the rechargeable battery 11 is illustratively described to have three serial set and two parallel cell construction, the number of battery cells connected in parallel and the number of serial sets can be suitably adjusted depending on desired battery specifications of rating output voltage and rating output current capacity.

A switch element 13 such as FET is provided on a charging/discharging path and connected to the rechargeable battery 11 in the battery pack 10 in series, and controls charging/discharging operation of the rechargeable battery 11. A current detecting portion (shunt resistor) 14 is connected to the rechargeable battery 11 in the battery pack 10 in series, and detects a charging/discharging current. The controller 12 provided in the battery pack 10 can be composed of a microprocessors (MPU), for example. The controller 12 includes a controlling/calculating portion 15 as main function, a voltage detecting portion 16, and a communication processing portion 17. The voltage detecting portion 16 detects a terminal voltage of the rechargeable battery 11, more specifically a terminal voltage (cell voltage) of each set of battery cells. The communication processing portion 17 communicates information to the load device 20.

The controlling/calculating portion 15 monitors the charged/discharged state of the rechargeable battery 11 based on a temperature (battery temperature) of the rechargeable battery 11 detected by a temperature detecting element 19 such as thermistor, cell voltages detected by the voltage detecting portion 16, and a charging/discharging current detected by the current detecting portion 14. The controlling/calculating portion 15 controls ON/OFF of the switch element 13 to protect the rechargeable battery 11 from abnormal states in charging/discharging operation. The controlling/calculating portion 15 also provides control instructions to the electronic device 20 via the communication processing portion 17, and thus controls charging voltage and charging current of the rechargeable battery 11.

The electronic device 20 is basically supplied with power from utility power (not shown; commercial power), and drives a load 21 as main function of the electronic device 20. The electronic device 20 includes a control/power-supply portion 22 that supplies power to the battery pack 10 to charge the aforementioned rechargeable battery 11. For example, when utility power is not supplied, the control/power-supply portion 22 is supplied with power by the rechargeable battery 11 of the battery pack 10, and drives the load 21 by using the power from the rechargeable battery 11. In the case where the rechargeable battery 11 is a lithium ion battery, the control/power-supply portion 22 charges the rechargeable battery 11 in a constant current and constant voltage charging manner in that a charging current and a charging voltage are limited to values not higher than the maximum current (typically, about 0.5 to 1 C) and the maximum voltage (typically, about 4.2 V/cell), respectively, as disclosed in JP 2002-78222 A.

In addition, the control/power-supply portion 22 also serves to communicate information to the communication processing portions 17 in the battery pack 10 via a data line SDA and a clock line SCL based on SMBUS, for example. The control portion 12 of the battery pack 10 uses the aforementioned information-communicating function, and controls the operation of the control/power-supply portion 22 so that charging voltage and charging current of the rechargeable battery 11 provided by the control/power-supply portion 22 are variably specified. Charging operation of the rechargeable battery 11 can be controlled in a charging manner as discussed later based on this control by the control/power-supply portion 22.

The controlling/calculating portion 15 realized by the microprocessor executes a software program previously installed in a memory 18, and can realize an operation mode setting function (operation mode setting section) 15a, a charging/discharging operation controlling function (charging/discharging control section) 15b, a fully-charged state detecting function (people charge detecting section) 15c, and a remaining capacity calculating function (remaining capacity calculating section) 15d, for example. Although the aforementioned controlling/calculating portion 15 includes, in addition to the aforementioned functions 15a to 15d, various types of battery pack 10 safety-operating functions such as rechargeable battery 11 failure/abnormality monitoring function, performance (life) determination function, such various types of safety-operating functions do not directly relate to the main functions of the present invention, therefore, their description is omitted for sake of brevity.

The operation mode setting function 15a detects a state of a mode switching switch (not shown) disposed in the battery pack 10 or receives the selection instruction of operation mode provided from the electronic device 20, and selects an operation mode, for example, a high capacity mode (Runtime; RT mode) or a long life mode (Lifespan; LS mode) of the rechargeable battery 11. In the high capacity mode (RT mode), in the case where the rechargeable battery 11 is the lithium ion battery, the maximum charging voltage of the rechargeable battery 11 is limited to a first voltage (e.g., 4.20 V/cell) in charging operation so that a charged capacity of the rechargeable battery 11 can be sufficiently high. In the long life mode (LS mode), the maximum charging voltage of the rechargeable battery 11 is limited to a second voltage (e.g., 4.20 V/cell) lower than the first voltage so that although a charged capacity of the rechargeable battery 11 is limited to a certain capacity, the number of repetition charging/discharging operation cycles, i.e., the cycle life of the rechargeable battery 11 can be increased.

As discussed above, the rechargeable battery (lithium ion battery) 11 is charged in the so-called constant current and constant voltage charging manner in that a charging current and a charging voltage are limited. Specifically, in the case of charging operation of the rechargeable battery 11 that includes lithium ion battery cells connected in three serial set and two parallel cell construction, the rechargeable battery 11 can be charged at a constant current and a constant voltage by a constant-current/constant-voltage power supply that has the maximum output current of 5000 mA and the maximum output voltage of 4.20 V/cell, for example. The aforementioned first and second voltages correspond to limit values of maximum charging voltages of the rechargeable battery 11 in the constant current and constant voltage charging operation in the high capacity mode (RT mode) and the long life mode (LS mode), respectively.

The charging/discharging operation controlling function 15b in the controlling/calculating portion 15 controls charging operation of the rechargeable battery 11 in accordance with a limit condition, specifically limits a charging voltage to the maximum charging voltage, depending on a selected operation mode of the aforementioned operation modes, and also controls discharging operation of the rechargeable battery 11 by limiting a discharging current to a maximum discharging current. The fully-charged state detecting function 15c serves to monitor the charging current of the rechargeable battery 11 under the aforementioned charging operation control. For example, if the charging current becomes lower than 100 mA and is continuously kept lower than 100 mA for a predetermined period (e.g., three minutes), the fully-charged state detecting function 15c determines that the rechargeable battery 11 is charged to the fully-charged state.

Also, the remaining capacity calculating function 15d in the controlling/calculating portion 15 basically integrates the amount of power ($\Delta W$; unit [AV] or [W]) acquired based on the product of a charging/discharging current value of the rechargeable battery 11 detected by the current detecting portion 14 and a voltage value of the rechargeable battery 11 or the amount ($\Delta l$; unit [mAh]) acquired based on the charging/discharging current value and a current flowing time whereby calculating a charged capacity (CC; Charge Capacity) or discharged capacity (DCC; Discharge Capacity) of the rechargeable battery 11. In addition, the remaining capacity calculating function 15d serves to calculate the ratio of the remaining capacity (RC; Remaining Capacity) to the fully-charged capacity (FCC; Full Charge Capacity) of the rechargeable battery 11 as relative remaining capacity (RSOC; Relative State Of Charge).

Specifically, in the calculation of the relative remaining capacity (RSOC), the charged capacity (CC) is used as remaining capacity (RC) in charging operation, while the remaining capacity (RC) is acquired as a capacity (FCC-DCC) that is obtained by subtracting the discharged capacity (DCC) from the fully-charged state current (FCC) in discharging operation as shown by the following equation.

$$RSOC = RC/FCC \times 100[\%]$$

The electronic device 20 provided via the aforementioned communication processing portion 17 with the relative remaining capacity (RSOC) of the rechargeable battery 11 acquired by the remaining capacity calculating function 15d.

Basically, the features of the thus-constructed battery pack 10 according to the present invention are that a single rating capacity (DC; Design Capacity) or a single fully-charged capacity (FCC) of the rechargeable battery 11 is ascertained irrespective of operation modes, and that the charged capacity (RC) or the discharged capacity (DCC) in charging/discharging operation of the rechargeable battery 11 is uniquely acquired so that the relative remaining capacity (RSOC) of the rechargeable battery 11 is calculated depending on a selected operation mode.

Conventionally, in order to accurately acquire the relative remaining capacity (RSOC) in the case where an operation mode of the battery pack 10 is selected from the high capacity mode (RT mode) and the long life mode (LS mode) as discussed above, it will be required to ascertain rating capacities (DC) and fully-charged capacities ($FCC_{(RT)}$, $FCC_{(LS)}$) depending on the operation modes. In addition, the ascertainment may be complicated due to different ascertainment processes of the remaining capacities (RC) depending on the operation modes, which will be required.

As compared with this, according to the present invention, the rating capacity (DC) and fully-charged capacity (FCC) of the rechargeable battery 11 are unitary ascertained irrespective of the aforementioned operation modes, and the relative remaining capacity (RSOC) is acquired depending on a selected operation mode as discussed below. As shown in a conceptual illustration of FIG. 2, since the rechargeable battery 11 can be charged to the rating capacity (DC) in the high capacity mode (RT mode), this rating capacity (DC) is defined as the fully-charged capacity ($FCC_{(RT)}$) of the high capacity mode (RT mode). Contrary to this, the maximum charging voltage is set lower so that the charged amount of the rechargeable battery is limited in the long life mode (LS mode). Correspondingly, 90% of the rating capacity (DC) is defined as the fully-charged capacity ($FCC_{(LS)}$) of the long life mode (LS mode) in accordance with the limited charged amount of the rechargeable battery in the relative remaining capacity calculation. The relative remaining capacity (RSOC) is calculated based on the remaining capacity (RC) by selectively employing one of the fully-charged capacities ($FCC_{(RT)}$, $FCC_{(LS)}$) depending on a selected operation mode.

Figure 2:
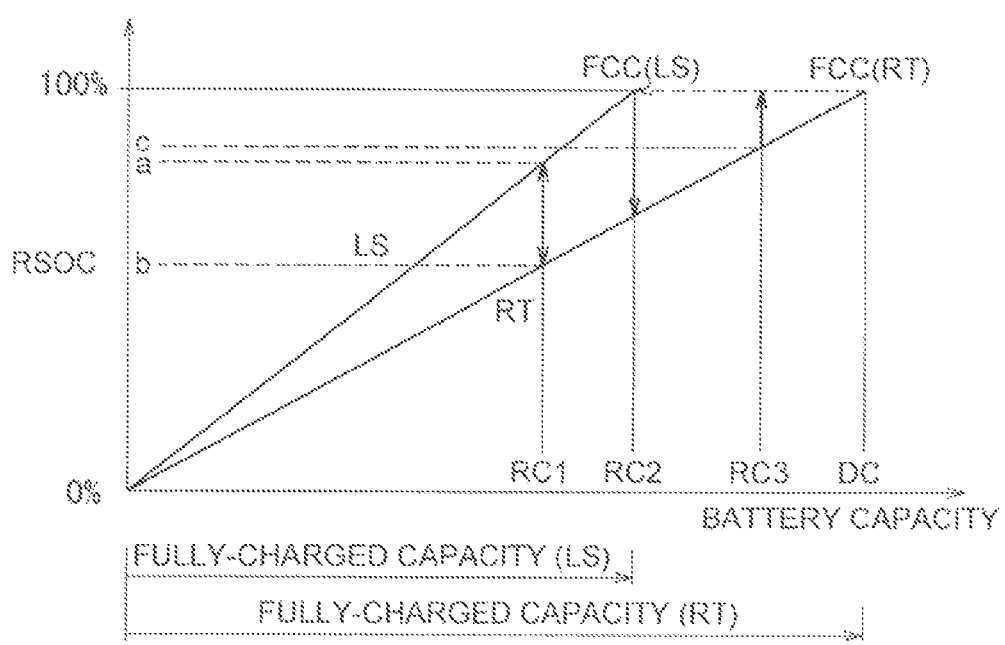
FIG. 2 is a graph showing relationship between the battery capacity, and the fully-charged capacity or relative remaining capacity of a rechargeable battery in the battery pack according to the present invention.

Accordingly, for example, if a remaining capacity (RC) of the rechargeable battery 11 is a vale [RC1] that is less than the fully-charged capacity ($FCC_{(LS)}$) of the long life mode (LS mode) in FIG. 2, a relative remaining capacity (RSOC) is acquired as a [=RC1/$FCC_{(LS)}$] in the long life mode (LS mode), while a relative remaining capacity (RSOC) is acquired as b [=RC1/$FCC_{(RT)}$] in the high capacity mode (RT mode). In this case, when the operation mode is switched from one to another, a relative remaining capacity (RSOC) is reacquired by changing the fully-charged capacity (FCC) from one to another.

On the other hand, for example, if a remaining capacity (RC) of the rechargeable battery 11 is a vale [RC3] that exceeds the fully-charged capacity ($FCC_{(LS)}$) of the long life mode (LS mode) in FIG. 2, a relative remaining capacity (RSOC) is acquired as b [=RC1/$FCC_{(RT)}$] in the high capacity mode (RT mode), but in this case, when the operation mode is switched to the long life mode (LS mode), a relative remaining capacity (RSOC) at this time is acquired as 100% (fully-charged state). After that, a relative remaining capacity (RSOC) is acquired as 100% until a remaining capacity (RC) decreases to the fully-charged capacity of the long life mode (LS mode) ($FCC_{(LS)}$=RC2).

Figure 3:
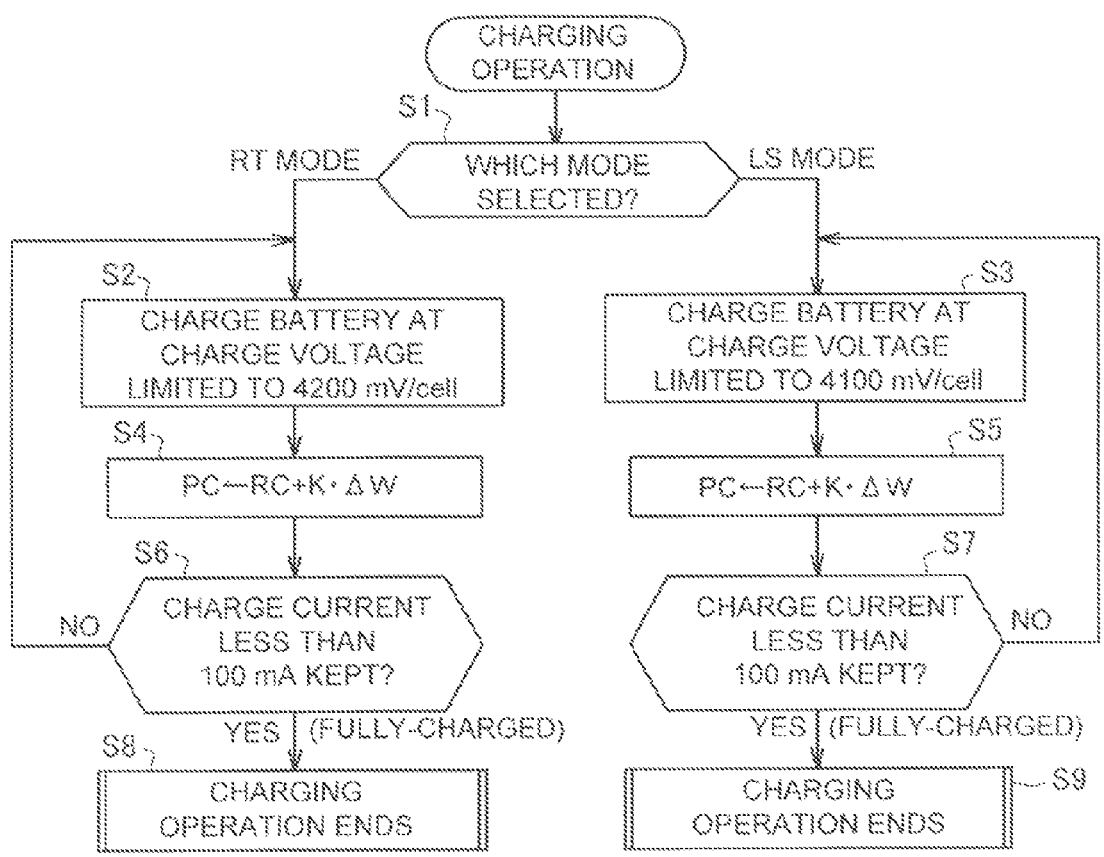
FIG. 3 is a flowchart of charging operation control.

FIG. 3 is a flowchart showing operation procedure for acquiring a relative remaining capacity (RSOC) depending on a selected operation mode in charging operation of the battery pack 10. As shown by the operation procedure, in charging operation of the rechargeable battery 11, a selected operation mode is first determined <Step S1>. If the high capacity mode (RT mode) is selected, the maximum charging voltage is set at 4200 mV/cell (first voltage), for example, and charging operation of the rechargeable battery 11 starts <Step S2>. On the other hand, if the long life mode (LS mode) is selected, the maximum charging voltage is set at the second voltage of 4100 mV/cell, which is lower than the first voltage by 100 mV/cell, and charging operation of the rechargeable battery 11 starts.

In this embodiment, a single power supply is used to charge the rechargeable battery 11 both in the high capacity mode (RT mode) and the long life mode (LS mode). The single power supply is controlled so as to apply a voltage not higher than the second voltage to the rechargeable battery 11 in the long life mode (LS mode). Specifically, the power supply can be controlled so as to stop charging operation when a battery voltage reaches the second voltage or to reduce a charging current every when a battery voltage reaches the second voltage, for example. Needless to say, the rechargeable battery 11 may be charged by a first power supply with the maximum charging voltage of 4200 mV/cell (first voltage) in the high capacity mode (RT mode), while the rechargeable battery 11 may be charged by a second power supply with the maximum charging voltage of 4100 mV/cell (second voltage) in the long life mode (LS mode).

The rechargeable battery 11 is charged in the constant current and constant voltage charging manner at the maximum charging current of 5000 mA, for example. After that, an actual charging amount per a predetermined unit time is acquired by multiplying a charging amount ΔW acquired based on a charging/discharging current per the predetermined unit time by a predetermined factor K, and this acquired actual charging amount per the predetermined unit time is added to a remaining capacity (RC) at the periods of predetermined unit times to update this remaining capacity (RC) <Step S4 or S5>. The thus-acquired remaining capacity (RC) is used to monitor a charged state or the like of the rechargeable battery 11 in charging operation, for example. In addition, although the aforementioned factor K is aimed at adjusting the increase rate of remaining capacity (RC), optionally, the aforementioned factor K may be omitted (fixed at 1).

In this charging procedure, it is determined whether the rechargeable battery 11 becomes its fully-charged state <Step S6 or S7>. The aforementioned charging operation steps are repeatedly executed if the rechargeable battery 11 does not become its fully-charged state. In the aforementioned fully-charged state determination step, the fully-charged state is determined whether a charging current of the rechargeable battery 11 is continuously kept not higher than 100 mA for three minutes or more, for example. If this condition is satisfied, it is determined that the rechargeable battery 11 becomes its fully-charged state in the selected operation mode so that the charging operation ends <Step S8 or S9>. According to this charging operation control, the rechargeable battery 11 is charged to $FCC_{(RT)}$ in the high capacity mode (RT mode), or to $FCC_{(LS)}$ in the long life mode (LS mode).

Figure 4:
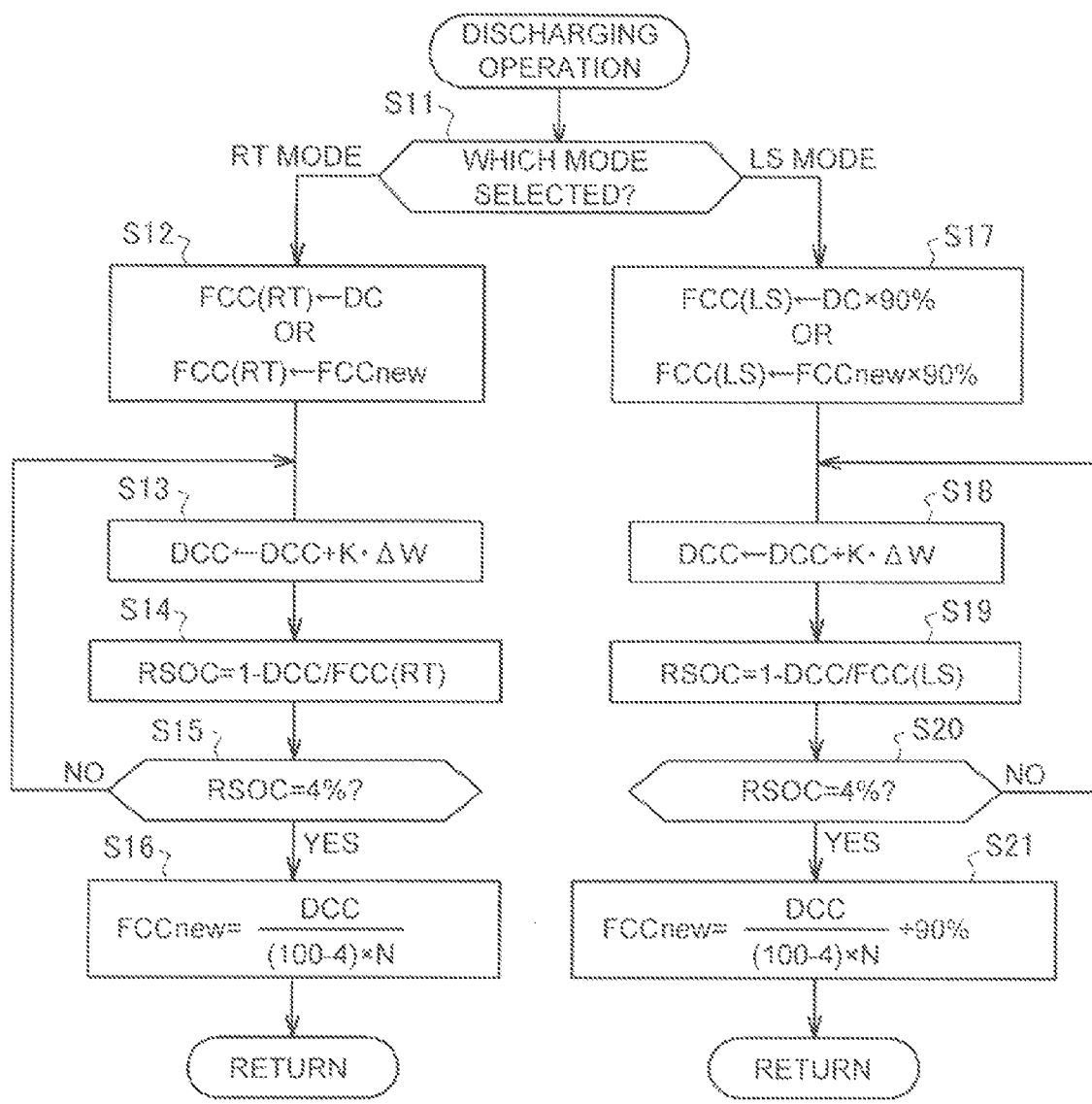
FIG. 4 is a flowchart showing calculation procedure of the relative remaining capacity in discharging operation, and calculation procedure of learned fully-charged capacity.

On the other hand, in discharging operation of the rechargeable battery 11, for example, as shown in FIG. 4, a remaining capacity (RC), more specifically a discharged capacity (DCC), of the rechargeable battery 11 is ascertained. A selected operation mode is first determined also in discharging operation <Step S11>. After that, if the high capacity mode (RT mode) is selected, the fully-charged capacity ($FCC_{(RT)}$) is set at the rating capacity (DC) or the later-discussed learned fully-charged capacity (FCCnew) of the rechargeable battery 11 <Step S12>. Specifically, in a discharging operation process after first charging operation process, the rating capacity (DC) of the rechargeable battery 11 is set as the fully-charged capacity ($FCC_{(RT)}$). After that, in a second or later discharging operation process after the first charging operation process, the fully-charged capacity of the rechargeable battery 11 will have been learned based on a discharged capacity in the previous discharging operation process as discussed later. Accordingly, the fully-charged capacity ($FCC_{(RT)}$) is set at a learned fully-charged capacity (FCCnew) that has been currently acquired.

After that, an actual discharging amount per the predetermined unit time is acquired by multiplying a discharging amount ΔW acquired based on a charging/discharging current per the predetermined unit time by the predetermined factor K, and this acquired actual discharging amount per the predetermined unit time is added to a discharged capacity (DCC) at the periods of predetermined unit times to update this discharged capacity (DCC) <Step S13>. In addition, optionally, the aforementioned factor K may be omitted (fixed at 1). A relative remaining capacity (RSOC) is calculated by using the following equation based on the thus-acquired discharged capacity (DCC) and the fully-charged capacity (FCC$_{(RT)}$) that is obtained as discussed above <Step S14>.

$$RSOC = RC/FCC_{(RT)}$$
$$= 1 - DCC/FCC_{(RT)}$$

The calculation steps are repeated until a relative remaining capacity (RSOC) decreases to 4% as lower discharging limit capacity <Step S15>. When a relative remaining capacity (RSOC) decreases to 4%, the fully-charged capacity (FCC) of the rechargeable battery 11 is learned based on a discharged capacity (DCC) by using the following equation <Step S16>.

$$FCCnew=DCC/(100-4)N$$

where N is a factor indicating a discharging efficiency.

On the other hand, if the long life mode (LS mode) is selected, a fully-charged capacity (FCC$_{(LS)}$) is first obtained by multiplying the rating capacity (DC) or a learned fully-charged capacity (FCCnew) of the rechargeable battery 11 by 90%, for example <Step S17>. Specifically, in a discharging operation process after first charging operation process, a fully-charged capacity (FCC$_{(LS)}$) is obtained by multiplying the rating capacity (DC) of the rechargeable battery 11 by 90%. After that, in a second or later discharging operation process after the first charging operation process, a fully-charged capacity of the rechargeable battery 11 will have been learned based on a discharged capacity in the previous discharging operation process as discussed later. Accordingly, the fully-charged capacity (FCC$_{(LS)}$) is obtained by multiplying the learned fully-charged capacity (FCCnew), which has been currently acquired, by 90%.

The factor 90% indicates the previously-acquired capacity ratio between the fully-charged capacity (FCC$_{(RT)}$) in the high capacity mode (RT mode) and the fully-charged capacity (FCC$_{(LS)}$) in the long life mode (LS mode).

After that, an actual discharging amount per the predetermined unit time is acquired similarly to the case of the aforementioned high capacity mode (RT mode), and this acquired actual discharging amount per the predetermined unit time is added to a discharged capacity (DCC) at the periods of predetermined unit times to update this discharged capacity (DCC) <Step S18>. A relative remaining capacity (RSOC) is calculated by using the following equation based on the thus-acquired discharged capacity (DCC) and the fully-charged capacity (FCC$_{(LS)}$) that is obtained as discussed above <Step S19>.

$$RSOC = RC/FCC_{(LS)}$$
$$= 1 - DCC/FCC_{(LS)}$$

Also, the calculation steps are repeated until the relative remaining capacity (RSOC) decreases to 4% as lower discharging limit capacity <Step S20>. When a relative remaining capacity (RSOC) decreases to 4%, the fully-charged capacity (FCC) of the rechargeable battery 11 is learned based on a discharged capacity (DCC) by using the following equation <Step S21>.

$$FCCnew=DCC/(100-4)N+90[\%]$$

That is, to ascertain a single fully-charged capacity (FCC), the fully-charged capacity acquired based on the aforementioned discharged capacity (DCC) is divided by 90% so that a learned fully-charged capacity (FCCnew) is acquired by employing the rating capacity (DC) of the rechargeable battery 11 as the basis (reference).

Figure 5:
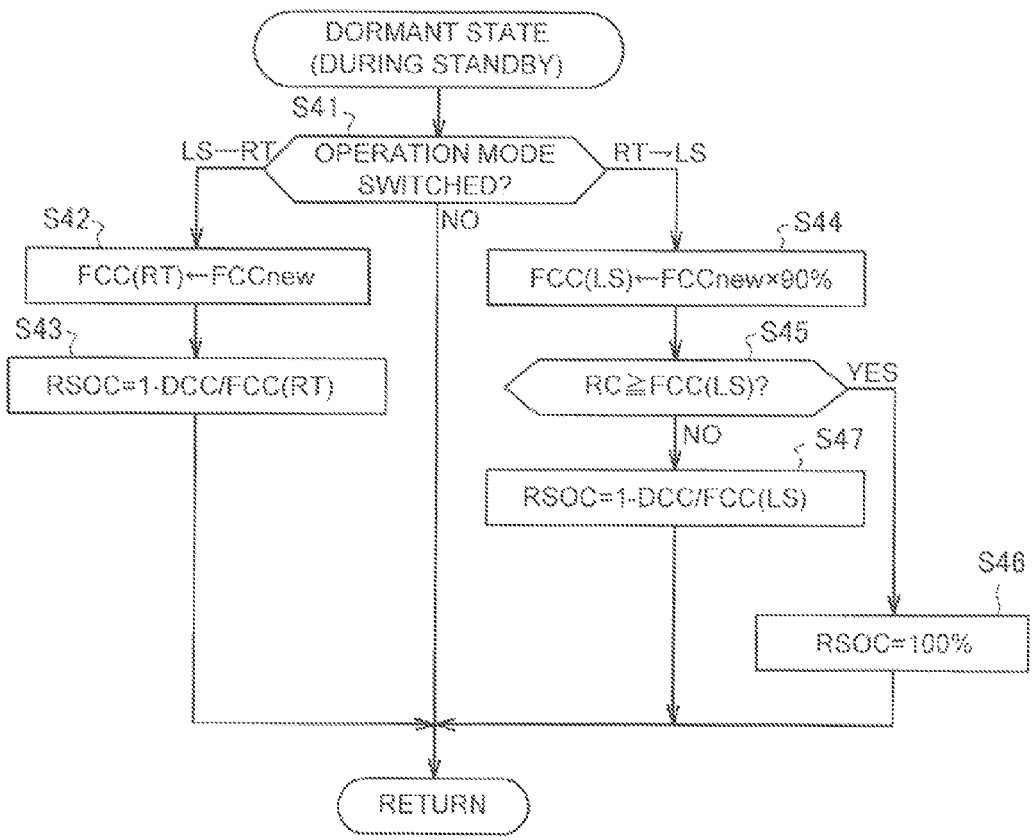
FIG. 5 is a flowchart showing calculation procedure of the relative remaining capacity when the operation mode is switched to another.
Figure 6:
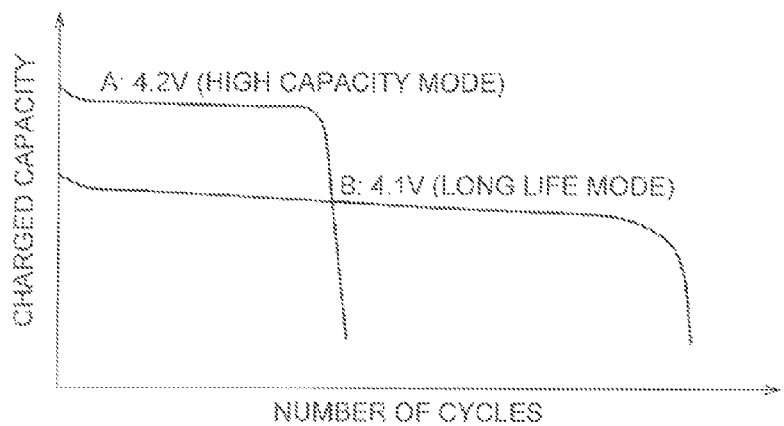
FIG. 6 is a graph showing the charged capacity and cycle life of a rechargeable battery (lithium ion battery) that vary in accordance with charging voltage.

In the case where the rechargeable battery 11 is not charged/discharged, for example, as shown in a flowchart of FIG. 5, it is determined whether the operation mode is switched from one to another <Step S41>. If the operation mode is switched from the long life mode (LS mode) to the high capacity mode (RT mode), a learned fully-charged capacity (FCCnew) is first reacquired as a fully-charged capacity (FCC$_{(RT)}$) in the high capacity mode (RT mode) <Step S42>. After that, a relative remaining capacity (RSOC) is recalculated based on the reacquired fully-charged capacity (FCC$_{(RT)}$) and the current discharged capacity (DCC) using the following equation <Step S43>.

$$RSOC = RC/FCC_{(RT)}$$
$$= CC/FCC_{(RT)}$$
$$= 1 - DCC/FCC_{(RT)}$$

On the other hand, if the operation mode is switched from the high capacity mode (RT mode) to the long life mode (LS mode), a fully-charged capacity (FCC$_{(LS)}$) in the long life mode (LS mode) is first reacquired by multiplying a learned fully-charged capacity (FCCnew) by 90% <Step S44>. After that, it is determined whether the current remaining capacity (RC) is less than the thus-reacquired fully-charged capacity (FCC$_{(LS)}$) <Step S45>. If the current remaining capacity (RC) is not less than the fully-charged capacity (FCC$_{(LS)}$), a relative remaining capacity (RSOC) is reacquired as 100% <Step S46>.

If the current remaining capacity (RC) is less than the fully-charged capacity (FCC$_{(LS)}$), a relative remaining capacity (RSOC) is recalculated by using the following equation <Step S47>.

$$RSOC = RC/FCC_{(LS)}$$
$$= CC/FCC_{(LS)}$$
$$= 1 - DCC/FCC_{(LS)}$$

That is, in the case where the operation mode is switched from one to another, a fully-charged capacity (FCC) is reacquired depending on the selected operation mode, and a relative remaining capacity (RSOC) is recalculated based on the reacquired fully-charged capacity (FCC). As discussed above, according to the battery pack 10, which ascertains a single rating capacity (DC) or a single fully-charged capacity (FCC) of the rechargeable battery 11, it is possible to easily and precisely acquire the current relative remaining capacity (RSOC) depending on a selected operation mode. In addition, the fully-charged capacity (FCC) of the rechargeable battery 11 can be ascertained as the fully-charged capacity in the high capacity mode (RT), the fully-charged capacity (FCC$_{(LS)}$) in the long life mode (LS) can be acquired only by multiplying the fully-charged capacity in the high capacity mode (RT) by a predetermined factor (e.g., 90%). Since a remaining capacity (RC) of the rechargeable battery 11 does not change even if the operation mode is switched from one to another, the processing load for precisely acquiring a relative remaining capacity (RSOC) can be small.

The present invention is not limited to the foregoing embodiment. Although two operation modes of the rechargeable battery 11 have been illustratively described including the high capacity mode (RT) and the long life mode (LS) in this embodiment, needless to say, a middle mode between the high capacity mode (RT) and the long life mode (LS) can be provided. In this case, for example, the maximum charging voltage of the rechargeable battery 11 can be limited to 4.05 V/cell in the middle capacity (middle life) mode, and the fully-charged capacity in the middle capacity mode can be acquired by multiplying the rating capacity (DC) by 95%.

Also, in the embodiment shown in FIG. 4, a relative remaining capacity (RSOC) has been illustratively described to be acquired by subtracting the ratio of a discharged capacity (DCC) to the fully-charged capacity (FCC) from 1 (100%). However, needless to say, a remaining capacity (RC) can be acquired by subtracting a discharged capacity (DCC) in discharging operation from the fully-charged capacity (FCC), and a relative remaining capacity (RSOC) can be calculated based on this remaining capacity (RC) and the fully-charged capacity (FCC).

Although a learned fully-charged capacity (FCCnew) is learned as maximum available charging capacity in the high capacity mode (RT) in the foregoing embodiment, a learned fully-charged capacity (FCCnew) can be defined as common learned fully-charged capacity, and a learned fully-charged capacity in each mode can be acquired by multiplying the common learned fully-charged capacity by each factor. In this case, for example, a learned fully-charged capacity in the high capacity mode (RT) is acquired by multiplying a learned fully-charged capacity (FCCnew) by a factor of 1, while a learned fully-charged capacity in the long life mode can be acquired by multiplying a learned fully-charged capacity (FCCnew) by a factor of 0.9.

Also, a learned fully-charged capacity (FCCnew) can be learned as maximum available charging capacity in the long life mode (LS). In this case, a fully-charged capacity in the high capacity mode (RT) can be acquired by dividing the learned fully-charged capacity (FCCnew) by a factor less than 1, in other words, by multiplying the learned fully-charged capacity (FCCnew) by a factor more than 1.

Also, learned fully-charged capacities ($FCCnew_{(RT)}$, $FCCnew_{(LS)}$) in the high capacity mode (RT) and the long life mode (LS) can be individually learned. In this case, if the operation mode is switched from RT to LS, a new learned fully-charged capacity ($FCCnew_{(LS)}$) is acquired by multiplying a learned fully-charged capacity ($FCCnew_{(RT)}$) that has been acquired at the operation mode switching by a predetermined factor (e.g., 90%), while if the operation mode is switched from LS to RT, a learned fully-charged capacity ($FCCnew_{(RT)}$) suitable for newly-selected operation mode can be acquired by dividing a learned fully-charged capacity ($FCCnew_{(LS)}$) that has been acquired at the operation mode switching by a predetermined factor (e.g., 90%).

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2009-279448 filed in Japan on Dec. 9, 2009, the content of which is incorporated herein by reference.

What is claimed is:

1. A battery pack comprising:
a rechargeable battery; and
a controlling/calculating portion that controls charging/discharging operation of said rechargeable battery,
wherein said controlling/calculating portion comprises:
an operation mode setting section that selects a high capacity mode in that the maximum charging voltage of said rechargeable battery is limited to a first voltage so that the fully-charged capacity of said rechargeable battery can be higher, or a long life mode in that said maximum charging voltage is limited to a second voltage lower than said first voltage so that the cycle life of said rechargeable battery can be longer; and
a remaining capacity calculating section that acquires a discharged capacity of said rechargeable battery based on a discharging current and a discharging time or a discharging current and a battery voltage of said rechargeable battery, and calculates a relative remaining capacity of said rechargeable battery based on the discharged capacity and the fully-charged capacity of said rechargeable battery, and
wherein said remaining capacity calculating section employs the rating capacity or a learned fully-charged capacity of said rechargeable battery as said fully-charged capacity when one operation mode of said high capacity and long life modes is selected, and employs a capacity obtained by multiplying said rating capacity or learned fully-charged capacity by a predetermined factor as said fully-charged capacity when another operation mode is selected.

2. The battery pack according to claim 1, wherein said remaining capacity calculating section employs the rating capacity or a learned fully-charged capacity of said rechargeable battery as said fully-charged capacity when said high capacity mode is selected, and employs a capacity obtained by multiplying said rating capacity or learned fully-charged capacity by a predetermined factor not more than 1 as said fully-charged capacity when said long life mode is selected.

3. The battery pack according to claim 1, wherein said remaining capacity calculating section recalculates said relative remaining capacity, when the operation mode is switched from one to another.

4. The battery pack according to claim 1, wherein said rechargeable battery is a lithium ion battery, wherein said first voltage in said high capacity mode to which the maximum charging voltage is limited is set at 4.2 V/cell, and said second voltage in said long life mode to which the maximum charging voltage is limited is set at 4.1 V/cell.

5. The battery pack according to claim 1, wherein said learned fully-charged capacity is acquired by dividing said discharged capacity by a variation amount of relative remaining capacity in discharging operation in the high capacity mode, and is acquired by dividing a capacity acquired by dividing said discharged capacity by a variation amount of relative remaining capacity in discharging operation by said predetermined factor not more than 1 in the long life mode.

6. The battery pack according to claim 1, wherein said learned fully-charged capacity is updated every when a predetermined cycle of charging/discharging operation ends.

7. The battery pack according to claim 1, wherein said remaining capacity calculating section employs said fully-charged capacity depending on a selected operation mode and calculates the relative remaining capacity based on the rating capacity of said rechargeable battery when said rechargeable battery is charged to the fully-charged state for the first time, and after that employs said fully-charged capacity depending on a selected operation mode and calculates the relative remaining capacity based on the learned fully-charged capacity, which is calculated in discharging operation, when said rechargeable battery is discharged to a capacity lower than a predetermined lower discharging limit capacity.

8. The battery pack according to claim 1, wherein said remaining capacity calculating section restricts the maximum value of relative remaining capacity to 100% when the operation mode is switched from the high capacity mode to the long life mode.

* * * * *